United States Patent
Lee et al.

(10) Patent No.: US 9,754,950 B2
(45) Date of Patent: Sep. 5, 2017

(54) SEMICONDUCTOR DEVICE INCLUDING TRANSISTOR HAVING OFFSET INSULATING LAYERS

(71) Applicant: SK hynix Inc., Gyeonggi-do (KR)

(72) Inventors: Dong Hwan Lee, Gyeonggi-do (KR); Min Gyu Koo, Gyeonggi-do (KR); Hyun Heo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/864,159

(22) Filed: Sep. 24, 2015

(65) Prior Publication Data

US 2016/0322370 A1 Nov. 3, 2016

(30) Foreign Application Priority Data

Apr. 28, 2015 (KR) .......................... 10-2015-0059962
Aug. 5, 2015 (KR) .......................... 10-2015-0110684

(51) Int. Cl.
| | |
|---|---|
| H01L 27/115 | (2017.01) |
| H01L 29/66 | (2006.01) |
| H01L 29/06 | (2006.01) |
| H01L 29/10 | (2006.01) |
| H01L 27/11529 | (2017.01) |
| H01L 27/11573 | (2017.01) |
| H01L 27/11526 | (2017.01) |
| H01L 29/78 | (2006.01) |
| H01L 27/11556 | (2017.01) |
| H01L 27/11582 | (2017.01) |

(Continued)

(52) U.S. Cl.
CPC .. *H01L 27/11529* (2013.01); *H01L 27/11526* (2013.01); *H01L 27/11573* (2013.01); *H01L 29/0623* (2013.01); *H01L 29/0653* (2013.01); *H01L 29/6659* (2013.01); *H01L 29/7833* (2013.01); *H01L 21/26586* (2013.01); *H01L 27/1157* (2013.01); *H01L 27/11556* (2013.01); *H01L 27/11582* (2013.01); *H01L 29/1083* (2013.01)

(58) Field of Classification Search
CPC .......... H01L 27/11529; H01L 29/0653; H01L 29/66537; H01L 29/0649; H01L 29/1083
See application file for complete search history.

(56) References Cited

U.S. PATENT DOCUMENTS

2006/0113627 A1* 6/2006 Chen ................. H01L 21/76829
257/500
2007/0273001 A1* 11/2007 Chen ..................... H01L 21/761
257/500

(Continued)

FOREIGN PATENT DOCUMENTS

| KR | 100476705 | 3/2005 |
|---|---|---|
| KR | 1020070073235 | 7/2007 |

(Continued)

*Primary Examiner* — Daniel Luke
(74) *Attorney, Agent, or Firm* — IP & T Group LLP

(57) ABSTRACT

A semiconductor device includes a substrate having a memory array region and a peripheral region, isolation layers formed in the peripheral region to define an active region, offset insulating layers separated from each other and formed in the active region, and a gate electrode having edges overlapping with the offset insulating layers and arranged in the active region between the offset insulating layers.

11 Claims, 11 Drawing Sheets

(51) Int. Cl.
*H01L 27/1157* (2017.01)
*H01L 21/265* (2006.01)

(56) References Cited

U.S. PATENT DOCUMENTS

2010/0078721 A1* 4/2010 Fujii .................. H01L 29/0653
 257/344
2010/0200930 A1* 8/2010 Fujii ............... H01L 21/823418
 257/391
2012/0126308 A1* 5/2012 Kim .................. H01L 27/11524
 257/324

FOREIGN PATENT DOCUMENTS

| KR | 1020090007862 | 1/2009 |
| KR | 1020160114907 | 10/2016 |

* cited by examiner

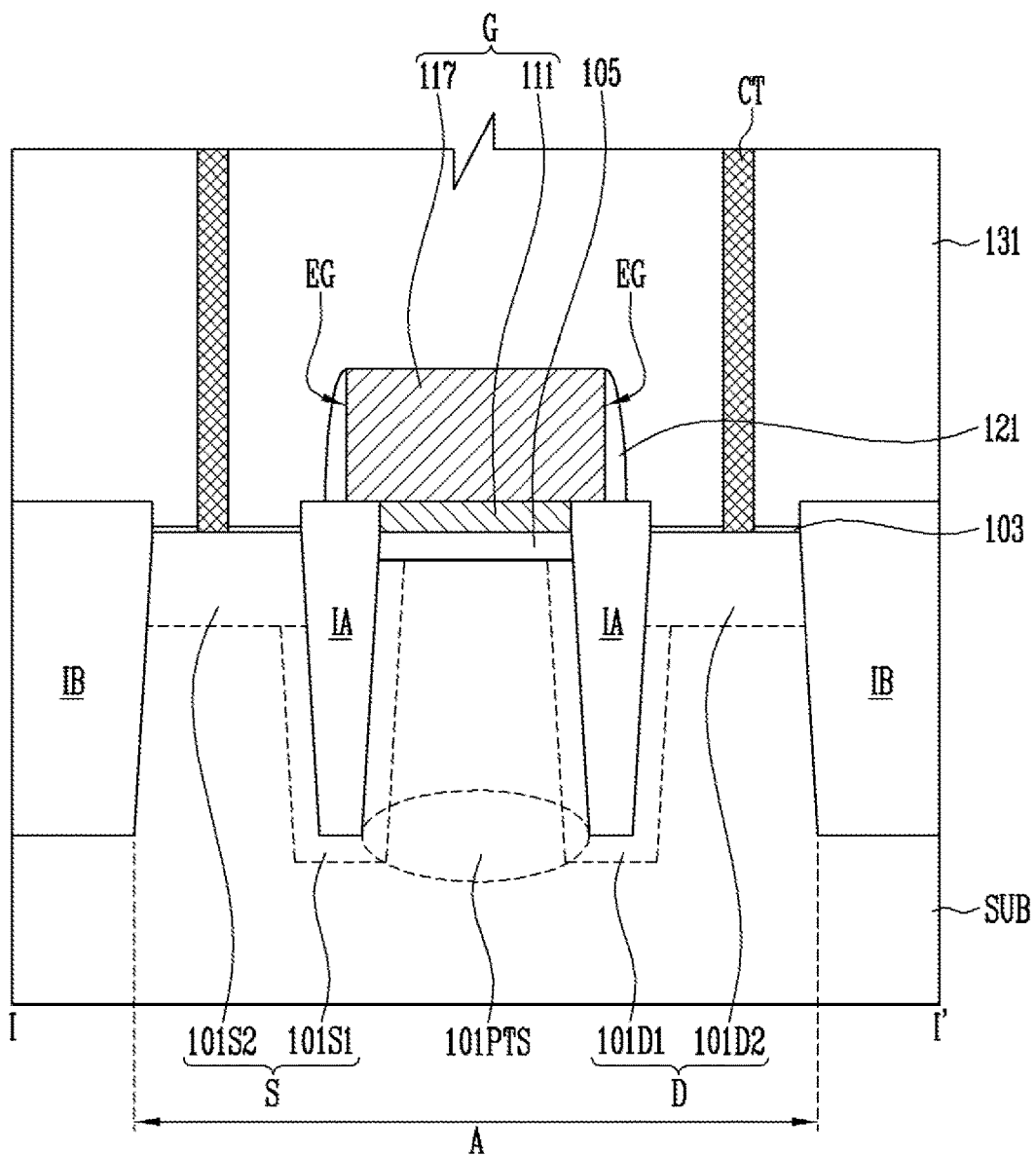

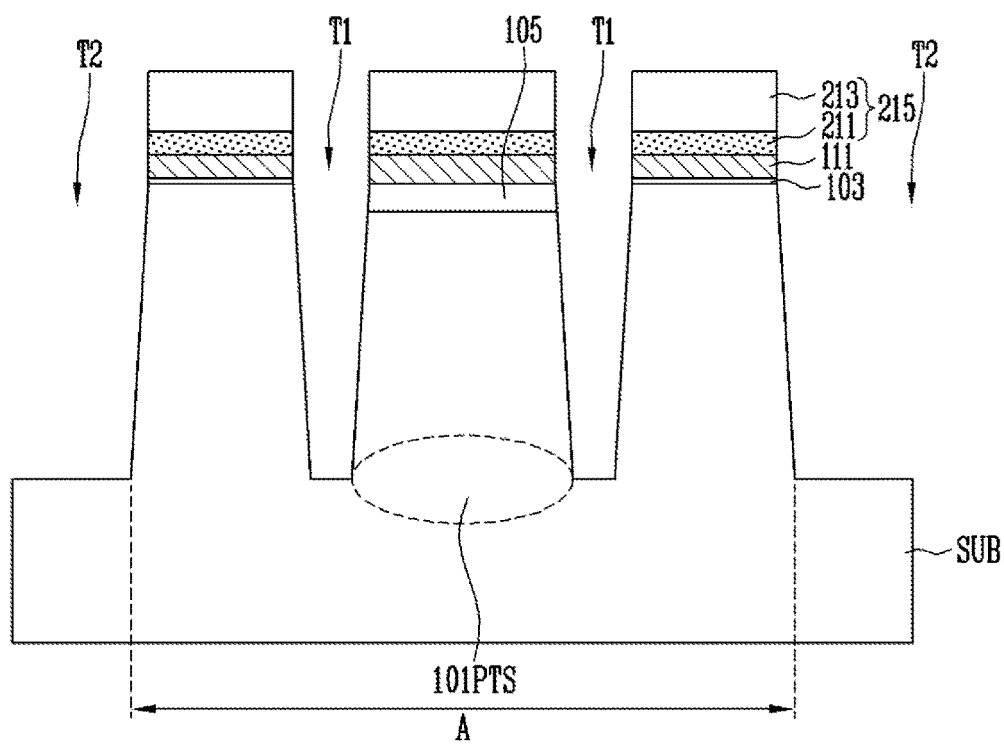
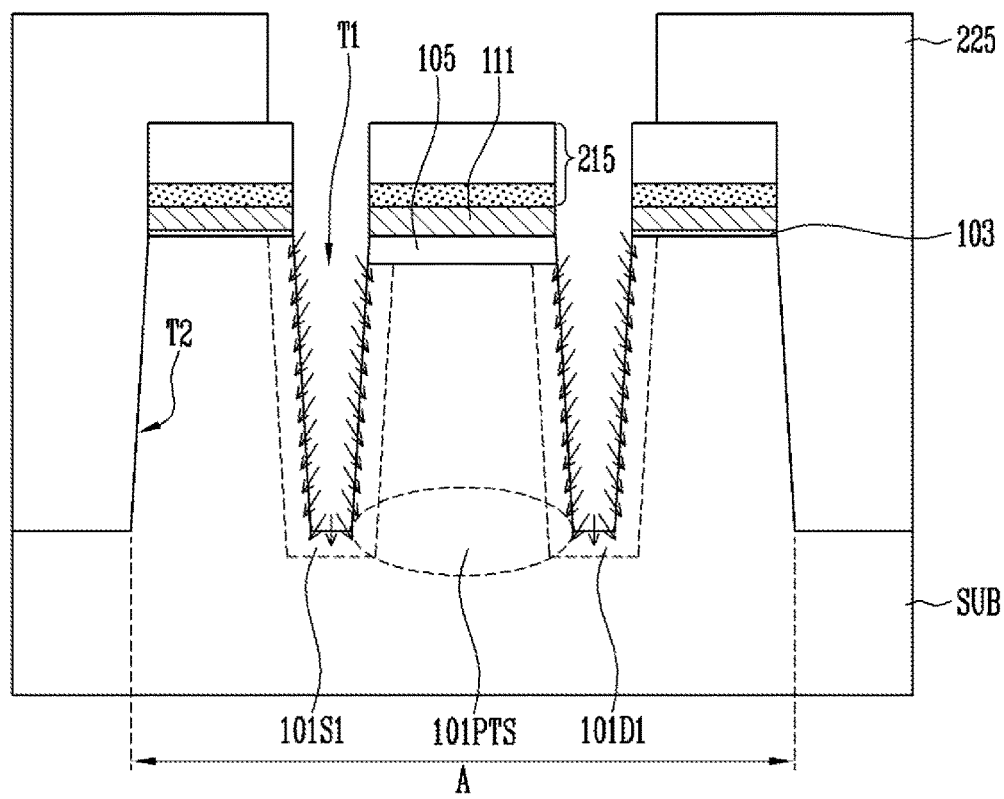

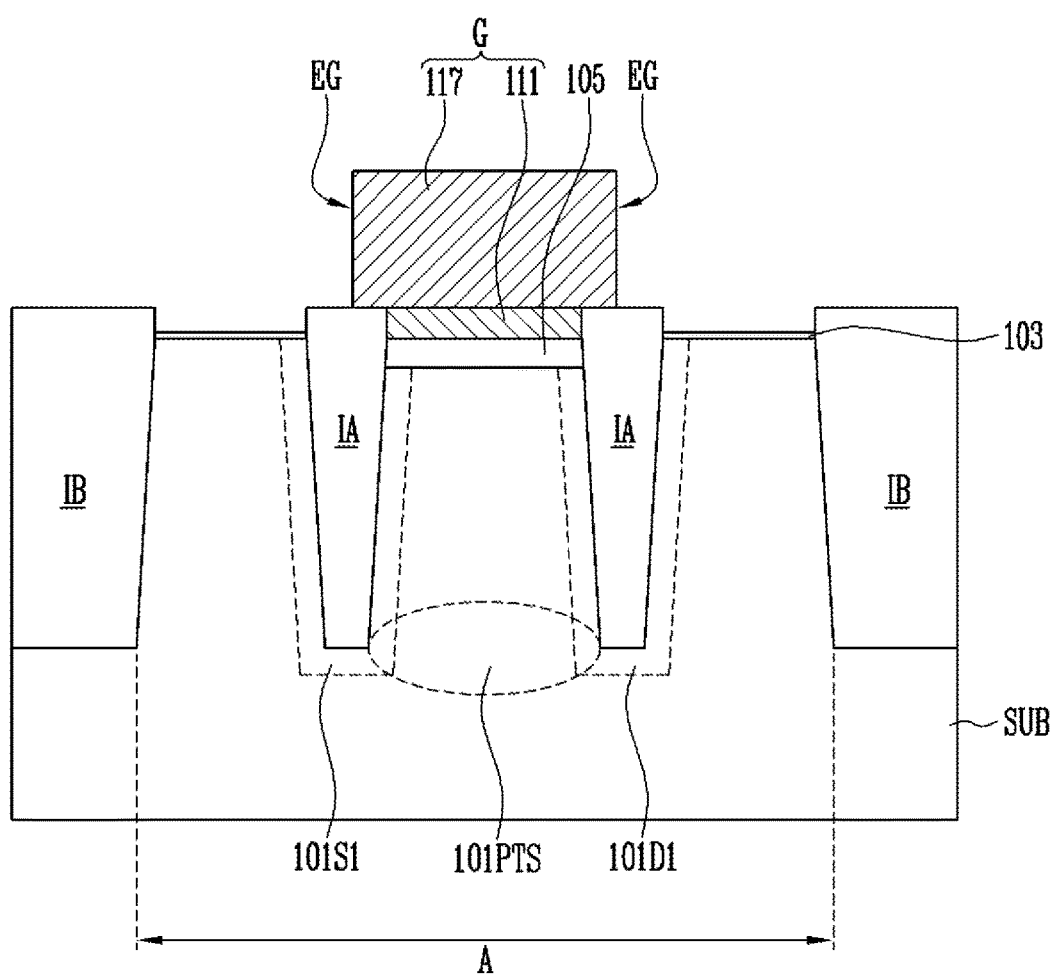

SEMICONDUCTOR DEVICE INCLUDING TRANSISTOR HAVING OFFSET INSULATING LAYERS

CROSS-REFERENCE TO RELATED APPLICATION

The present application claims priority to Korean patent application number 10-2015-0059962, filed on Apr. 28, 2015 and Korean patent application number 10-2015-0110684, filed on Aug. 5, 2015, the entire disclosures of which are herein incorporated by reference in their entirety.

BACKGROUND

Field of Invention

Various exemplary embodiments generally relate to a semiconductor device and a method of manufacturing the same, and more particularly, to a semiconductor device including a high voltage transistor and a method of manufacturing the same.

Description of Related Art

Semiconductor devices include a memory device which is capable of storing data. The memory device includes a memory array region and a peripheral region. Memory cells which store data may be arranged in the memory array region. A peripheral circuit configured to drive the memory cells is arranged in the peripheral region.

To drive the memory cells, a high voltage may be applied thereto. To apply a high voltage, the peripheral circuit may include a high voltage transistor. To achieve a high degree of integration of the semiconductor device, development of techniques for improving the characteristics of the high voltage transistor in a predetermined limited area is required.

SUMMARY

Various embodiments are directed to a semiconductor device capable of improving the characteristics of a high voltage transistor, and a method of manufacturing the same.

According to an embodiment, a semiconductor device may include a substrate including a memory array region and a peripheral region, isolation layers formed in the peripheral region to define an active region, offset insulating layers separated from each other and formed in the active region, and a gate electrode having edges overlapping with the offset insulating layers and arranged in the active region between the offset insulating layers.

According to an embodiment, a method of manufacturing a semiconductor device may include forming first trenches and second trenches at the same time, wherein the first trenches are formed in a peripheral region of a substrate, wherein the substrate includes a memory array region and the peripheral region, wherein the second trenches define an active region, and wherein the first trenches are provided between the second trenches, forming offset insulating layers in the first trenches and isolation layers in the second trenches, and forming a gate electrode in the active region between the offset insulating layers, wherein the gate electrode has edges overlapping with the offset insulating layers.

BRIEF DESCRIPTION OF THE DRAWINGS

FIGS. 3A and 3B are a plan view and a cross-sectional view, respectively, illustrating a high voltage transistor arranged in a peripheral region as shown in FIG. 1;

FIGS. 4A to 4G are cross-sectional views illustrating a method of manufacturing a high voltage transistor according to an embodiment;

DETAILED DESCRIPTION

Figure 1:
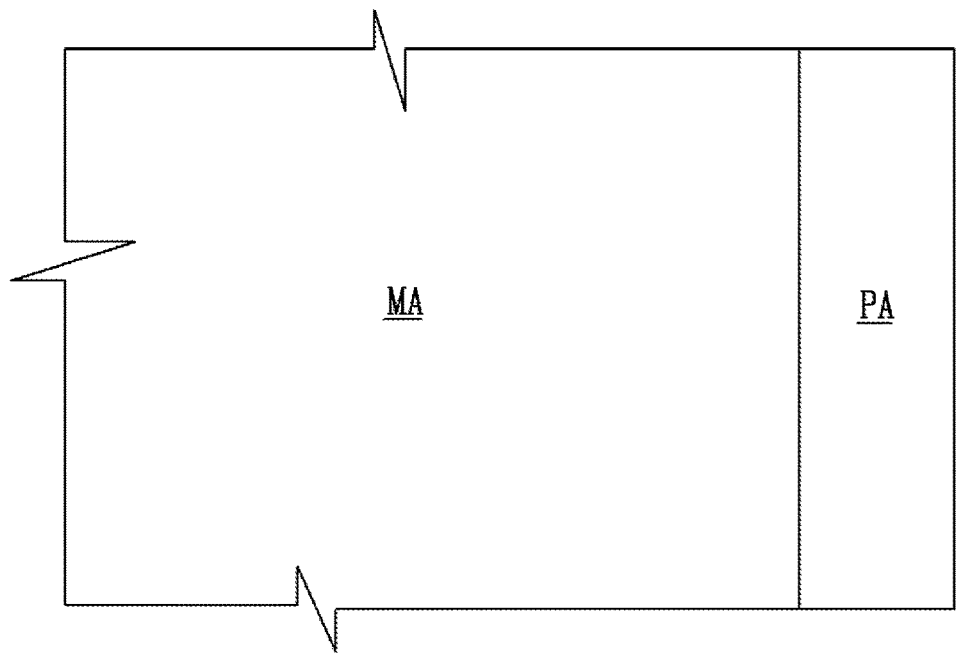
FIG. 1 is a diagram illustrating a semiconductor device according to an embodiment.

Hereinafter, various embodiments will be described with reference to the accompanying drawings. In the drawings, illustrated thicknesses and distances of components are exaggerated compared to an actual physical thickness and interval for convenience of illustration. In the following description, detailed descriptions of known related functions and constitutions are omitted to avoid unnecessarily obscuring the subject matter disclosed herein. Like reference numerals refer to like elements throughout the specification and drawings.

FIG. 1 is a diagram illustrating a semiconductor device according to an embodiment. Referring to FIG. 1, a semiconductor device according to an embodiment may include a memory array region MA and a peripheral region PA arranged on at least one side of the memory array region MA. Memory cells in which data is stored may be arranged in the memory array region MA. More specifically, the memory cells may be arranged in a two-dimensional or three-dimensional structure. Peripheral circuits for driving the memory cells may be arranged in the peripheral region PA. For example, the peripheral region PA may include a high voltage transistor which forms a circuit designed to apply a high voltage to the memory cells.

Figure 2A:
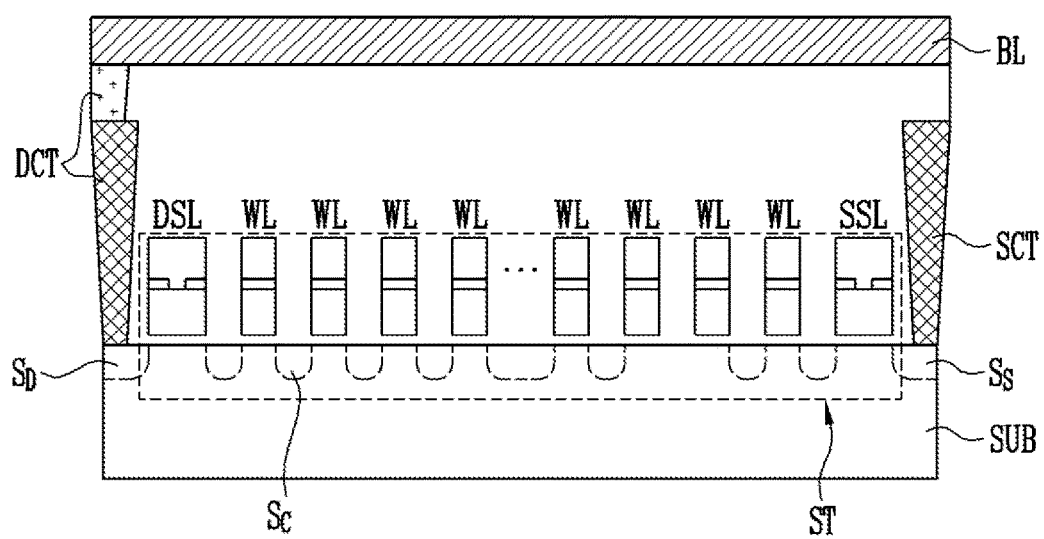
FIGS. 2A to 2C are diagrams illustrating memory strings arranged in a memory array region shown in FIG. 1.
Figure 2B:
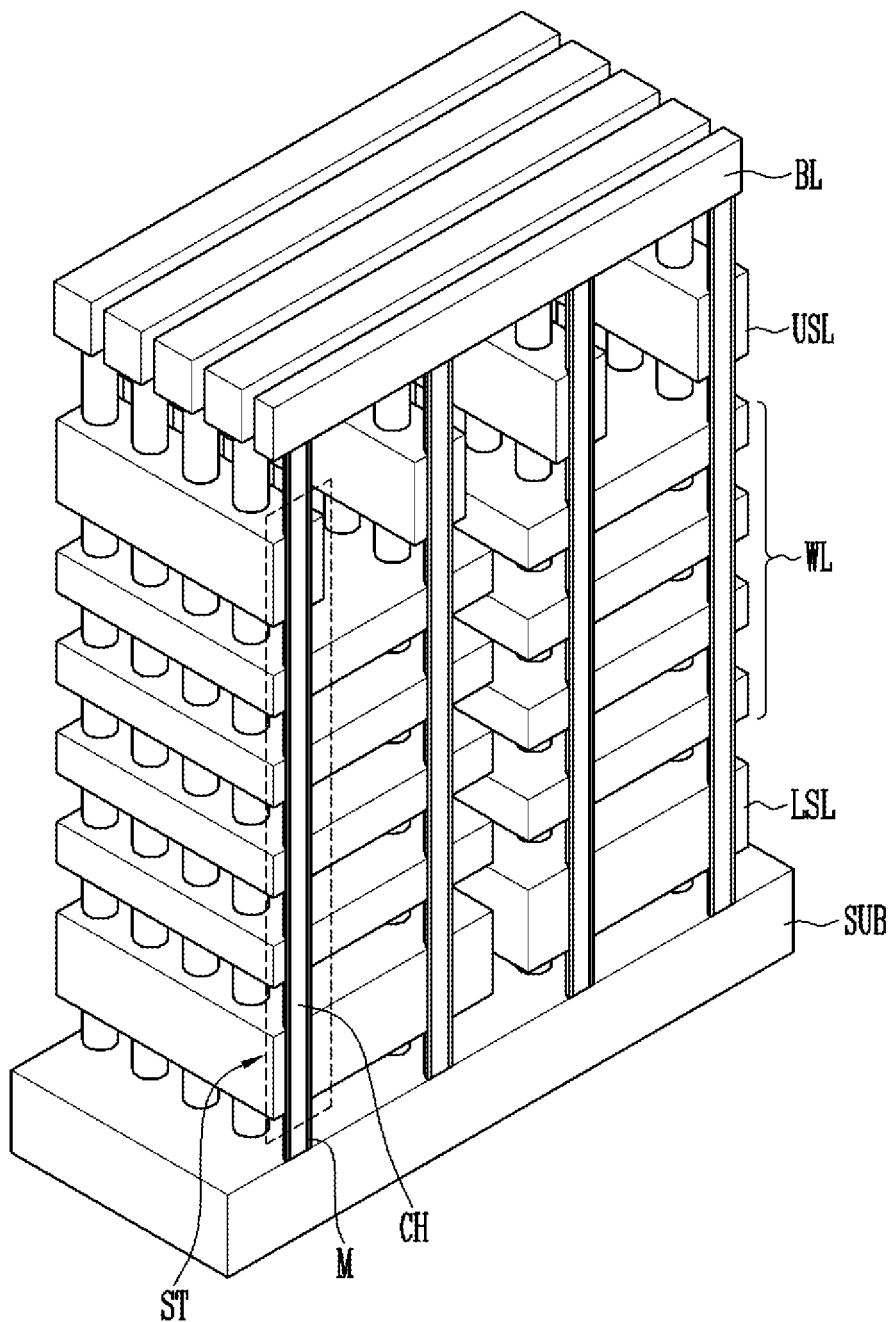
Figure 2C:
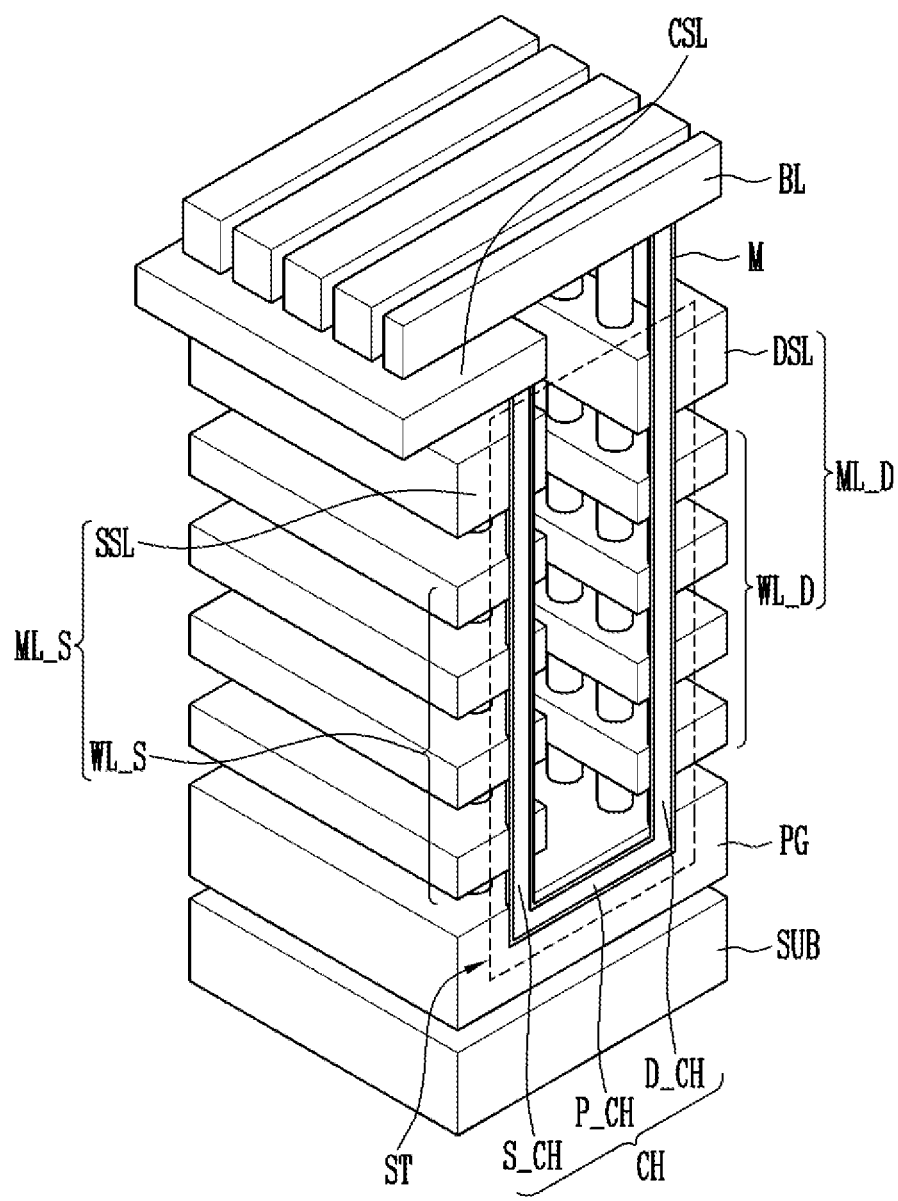

FIGS. 2A to 2C are diagrams illustrating memory strings arranged in the memory array region MA shown in FIG. 1. More specifically, FIG. 2A is a cross-sectional view of a two-dimensional memory string, and FIGS. 2B and 2C are perspective diagrams of three-dimensional memory strings. In FIGS. 2A to 2C, memory strings of a NAND flash memory device are exemplified.

Referring to FIG. 2A, a memory string ST may be coupled to a source selection line SSL, word lines WL and a drain selection line DSL which are formed on a substrate SUB. The word lines WL may be arranged between the source selection line SSL and the drain selection line DSL. The memory string ST may be formed along an active region of the substrate SUB. FIG. 2A is a cross-sectional view taken along the active region of the substrate SUB.

Each of the source selection line SSL, the word lines WL and the drain selection line DSL may include a control gate layer which extends in a direction crossing the active region. A dielectric layer, a data storage layer and a tunnel insulating layer may be arranged under each of the source selection line SSL, the word lines WL and the drain selection line DSL. The data storage layer may be located between the dielectric layer and the tunnel insulating layer and include polysilicon. The data storage layer may be formed only at an intersection between the control gate layer and the active region. The data storage layer of each of the source and drain selection lines SSL and DSL may be electrically connected to the control gate layer which passes through the dielectric layer. The dielectric layer of each of the word lines WL may be interposed between the control gate layer and the data storage layer to insulate these layers from each other.

In the above two-dimensional memory string, memory cells may be formed at intersections between the word lines WL and the active region. A drain selection transistor may be formed at an intersection between the drain selection line DSL and the active region. A source selection transistor may be formed at an intersection between the source selection line SSL and the active region.

Impurities may be injected into the substrate exposed by the source selection line SSL, the word lines WL, and the drain selection line DSL to form junction regions $S_S$ and $S_C$ and $S_D$. The junction regions $S_S$, $S_C$ and $S_D$ may include cell junction regions $S_C$ formed at both sides of each of the word lines WL, a drain region $S_D$ formed at one side of the drain selection line DSL, and a source region $S_S$ formed at one side of the source selection line SSL. The source region $S_S$ may be coupled to a source contact line SCT, and the drain region $S_D$ may be coupled to a bit line BL through drain contact plugs DCT. The cell junction regions $S_C$ may be arranged between the memory cells coupled to the word lines WL and couple the memory cells in series with each other.

In the above two-dimensional memory string, the source selection transistor, the memory cells, and the drain selection transistor coupled in series by the junction regions $S_S$, $S_C$ and $S_D$ may form the memory string ST and be arranged on the substrate SUB. In other words, the source selection transistor, the memory cells, and the drain selection transistor which form the memory string ST may be arranged in a row on the surface of the substrate SUB and may be arranged in a two-dimensional.

Referring to FIG. 2B, the memory string ST may be formed along a pillar type channel layer CH coupled to the substrate SUB. The memory string ST may include at least one lower selection line LSL, the word lines WL and at least one upper selection line USL which are separated from each other and stacked on the substrate SUB.

The substrate SUB may include a source region, and the channel layer CH may be coupled to the source region of the substrate SUB. The memory cells may be formed at intersections between the word lines WL and the channel layer CH, the lower selection transistor may be formed at an intersection between the lower selection line LSL and the channel layer CH, and the upper selection transistor may be formed at an intersection between the upper selection line USL and the channel layer CH. The memory string ST may include a lower selection transistor, memory cells and an upper selection transistor which are stacked on the substrate SUB. The lower selection transistor, the memory cells and the upper selection transistor which form the memory string ST may be coupled in series with each other by the pillar type channel layer CH which extends in a stacking direction thereof. The lower selection transistor, the memory cells and the upper selection transistor which form the memory string ST may be stacked along the pillar type channel layer CH. An upper end of the channel layer CH may be coupled to the bit line BL, and a lower end of the channel layer CH may be coupled to the source region of the substrate SUB.

An outer wall of the channel layer CH may be surrounded by a memory layer M. The memory layer M may include at least one of a tunnel insulating layer surrounding the channel layer CH, a data storage layer surrounding the tunnel insulating layer, and a blocking insulating layer surrounding the data storage layer.

Referring to FIG. 2C, the memory string ST may be formed on a U-shaped channel layer CH on the substrate SUB. The memory string ST may include a pipe gate PG, a source-side stacked body ML_S and a drain-side stacked body ML_D. The pipe gate PG may be separated from and stacked on the substrate SUB. The source-side stacked body ML_S and the drain-side stacked body ML_D may be separately stacked on the pipe gate PG and extend in parallel to each other.

The U-shaped channel layer CH may include a pipe channel layer P_CH formed in the pipe gate PG, a source-side channel layer S_CH and a drain-side channel layer D_CH. The source-side channel layer S_CH and the drain-side channel layer D_CH may extend from the pipe channel layer P_CH and pass through the source-side stacked body ML_S and the drain-side stacked body ML_D, respectively.

The source-side stacked body ML_S may include at least one source selection line SSL and source-side word lines WL_S stacked between the source selection line SSL and the pipe gate PG. The source-side channel layer S_CH may pass through the source-side word lines WL_S and the source selection line SSL and be coupled to a common source line CSL arranged over the source-side stacked body ML_S.

The drain-side stacked body ML_D may include at least one drain selection line DSL and drain-side word lines WL_D stacked between the drain selection line DSL and the pipe gate PG. The drain-side channel layer D_CH may pass through the drain-side word lines WL_D and the drain selection line DSL and be coupled to the bit line BL arranged over the drain-side stacked body ML_D.

The single memory string ST may include a pipe transistor, memory cells arranged in at least two rows, a drain selection transistor and a source selection transistor which are coupled in series along the U-shaped channel layer CH. The pipe transistor may be formed at an intersection between the pipe channel layer P_CH and the pipe gate PG.

The memory cells in the first row may be formed at intersections between the source-side word lines WL_S and the source-side channel layer S_CH, and separately stacked along the source-side channel layer S_CH. The memory cells in the second row may be formed at intersections between the drain-side word line WL_D and the drain-side channel layer D_CH, and separately stacked on the drain-side channel layer D_CH. The drain selection transistor may be formed at an intersection between the drain-side channel layer D_CH and the drain selection line DSL. The source selection transistor may be formed at an intersection between the source-side channel layer S_CH and the source selection line SSL.

An outer wall of the channel layer CH may be surrounded by the memory layer M. The memory layer M may include at least one of a tunnel insulating layer surrounding the channel layer CH, a data storage layer surrounding the tunnel insulating layer, and a blocking insulating layer surrounding the data storage layer.

Figure 3A:
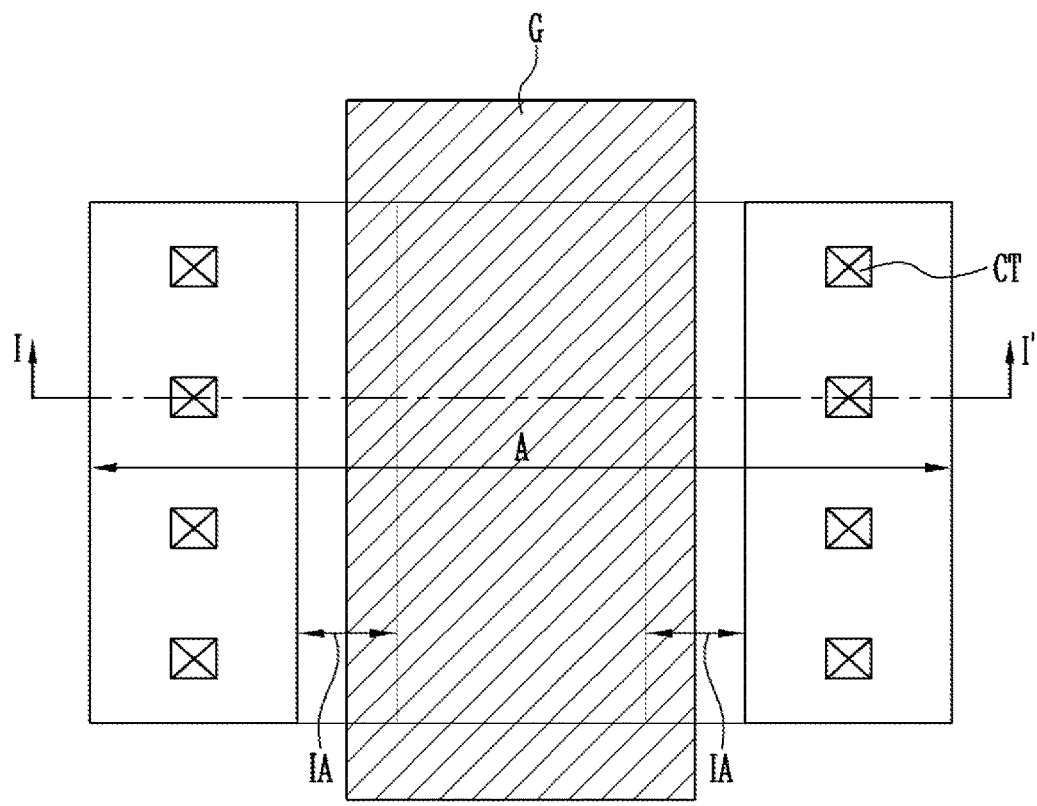

FIGS. 3A and 3B are a plan view and a cross-sectional view illustrating a high voltage transistor arranged in the peripheral region shown in FIG. 1. FIG. 3B is a cross-sectional view taken along the line shown in FIG. 3A.

Referring to FIGS. 3A and 3B, a high voltage transistor formed in a peripheral region may include a gate electrode G and junction regions 101S1, 101S2, 101D1 and 101D2 formed in the substrate SUB at both sides of the gate electrode G. The high voltage transistor may be covered by an insulating layer 131. The junction regions 101S1, 101S2, 101D1, and 101D2 of the high voltage transistor may be coupled to contact plugs CT passing through the insulating layer 131.

The gate electrode G of the high voltage transistor may be arranged over an active region A. The active region A may be defined by isolation layers IB arranged in the substrate SUB. Offset insulating layers IA may be formed in the active region A between the isolation layers IB and separated from each other. The offset insulating layers IA may be arranged between the gate electrode G and the contact plugs CT.

An effective distance between the gate electrode G and the contact plugs CT may be increased by the offset insulating layers IA. As a result, according to an embodiment, a breakdown voltage of a high voltage transistor in a predetermined limited area may be increased. The offset insulating layers IA may have substantially the same depth as the isolation layers IB. Therefore, according to an embodiment, a breakdown voltage of the high voltage transistor may be improved.

The gate electrode G may have edges EG overlapping with the offset insulating layers IA. Therefore, according to an embodiment, a leakage current of the high voltage transistor may be reduced. The offset insulating layers IA and the isolation layers IB may have surfaces which protrude more than the surface of the substrate SUB.

The gate electrode G may include a first gate 111 and a second gate 117. The first gate 111 may be arranged between upper ends of the offset insulating layers IA which protrude more than the substrate SUB. The second gate 117 may be formed on the first gate 111 and have the edges EG overlapping with the offset insulating layers IA. Spacers 121 may be formed on sidewalls of the gate electrode G. The spacers 121 may overlap with the offset insulating layers IA.

A first oxide layer 103 may be formed on the active region A between the isolation layers IB and the offset insulating layers IA which are adjacent to each other. A second oxide layer 105 having a greater thickness than the first oxide layer 103 may be formed on the active region A between the offset insulating layers IA. The second oxide layer 105 may be arranged between the gate electrode G and the substrate SUB and function as a gate insulating layer.

The junction regions 101S1, 101S2, 101D1, and 101D2 may include first junction regions 101S1 and 101D1 and second junction regions 101S2 and 101D2. The first junction regions 101S1 and 101D1 may include a first source junction region 101S1 and a first drain junction region 101D1. The second junction regions 101S2 and 101D2 may include a second source junction region 101S2 and a second drain junction region 101D2.

The first source junction region 101S1 and the first drain junction region 101D1 may be formed in the substrate SUB to a predetermined depth where bottoms of the offset insulating layers IA are located. Each of the second source junction region 101S2 and the second drain junction region 101D2 may be formed in the active region A between the offset insulating layer IA and the isolation layer IB adjacent to each other to a predetermined depth. The depth of the second source junction region 101S2 and the second drain junction region 101D2 may be shallower than the depth of first source junction region 101S1 and the first drain junction region 101D1.

The second source junction region 101S2 may be coupled to the first source junction region 101S1. The second drain junction region 101D2 may be coupled to the first drain junction region 101D1.

The first junction regions 101S1 and 101D1 may be formed to ensure an ON current of the high voltage transistor which may be reduced by the offset insulating layers IA, and include impurities with the same polarity as the second junction regions 101S2 and 101D2. An operational failure of the high voltage transistor which may be caused by the offset insulating layers IA may be prevented by the first junction regions 101S1 and 101D1. The first and second source junction regions 101S1 and 101S2, in combination, may serve as a source region S of the high voltage transistor. The first and second drain junction regions 101D1 and 101D2, in combination, may serve as a drain region D of the high voltage transistor.

Impurities having different concentrations may be injected into the first junction regions 101S1 and 101D1 and the second junction regions 101S2 and 101D2, respectively. For example, the first junction regions 101S1 and 101D1 may have a lower impurity concentration than the second junction regions 101S2 and 101D2 to prevent a short channel effect. In another example, the first junction regions 101S1 and 101D1 may have a higher impurity concentration than the second junction regions 101S2 and 101D2 to lower a resistance of a current path formed in the first junction regions 101S1 and 101D1.

A punch-through stop ion implantation portion 101PTS may be formed between bottom surfaces of the offset insulating layers IA. The punch-through stop ion implantation portion 101PTS may overlap with the gate electrode G. The punch-through stop ion implantation portion 101PTS may be arranged between the first source junction region 101S1 and the first drain junction region 101D1 and prevent a punch-through phenomenon between the source region S and the drain region D. In order to prevent the punch-through phenomenon between the source region S and the drain region D, the punch-through stop ion implantation portion 101PTS may include a different type of impurities from the first source junction region 101S1 and the first drain junction region 101D1. The punch-through stop ion implantation portion 101PTS may be formed at substantially the same level as the bottoms of the offset insulating layers IA.

The punch-through stop ion implantation portion 101PTS may include a first type of impurities. The junction regions 101S1, 101S2, 101D1, and 101D2 may include a second type of impurities different from the first type of impurities. For example, when the high voltage transistor is an NMOS transistor, the punch-through stop ion implantation portion 101PTS may include P type impurities, and the junction regions 101S1, 101S2, 101D1, and 101D2 may include N type impurities. More specifically, the punch-through stop ion implantation portion 101PTS may include boron, such as B11, and the junction regions 101S1, 101S2, 101D1, and 101D2 may include at least one of arsenic and phosphorous. For example, the first junction regions 101S1 and 101D1 may include phosphorous, and the second junction regions 101S2 and 101D2 may include phosphorous and arsenic.

The above-described high voltage transistor according to an embodiment may be used to drive the two-dimensional memory string as described above with reference to FIG. 2A or the three-dimensional memory string as described above with FIGS. 2B and 2C.

FIGS. 4A to 4G are cross-sectional views illustrating a method of manufacturing a high voltage transistor according to an embodiment. FIGS. 4A to 4G illustrate a portion of a peripheral region in which a high voltage transistor is formed.

Figure 4A:
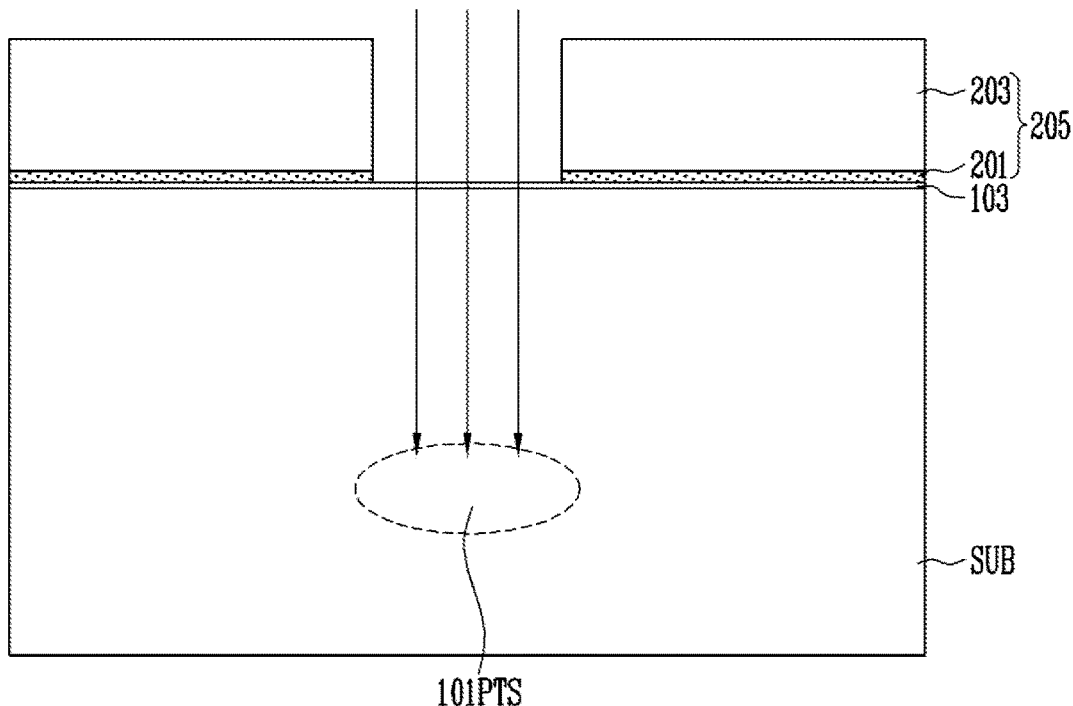

Referring to FIG. 4A, the first oxide layer 103 may be formed on the substrate SUB including the memory cell array region and the peripheral region. The first oxide layer 103 may function as a buffer layer when a subsequent impurity implanting process is performed. The first oxide layer 103 may serve as a gate insulating layer of the memory cell array region (not illustrated) or a gate insulating layer in a low voltage transistor region (not illustrated) of the peripheral region.

Subsequently, a first mask pattern 205 may be formed on the first oxide layer 103. The first mask pattern 205 may have a stacked structure including a first nitride layer pattern 201 and a first photoresist pattern 203. The first mask pattern 205 may define a high voltage transistor region. More specifically, the first mask pattern 205 may open a portion of the substrate SUB which corresponds to a region between first trenches which will be formed in subsequent processes.

Subsequently, a first type of impurities may be injected into the substrate SUB exposed by the first mask pattern 205 to form the punch-through stop ion implantation portion 101PTS. The punch-through stop ion implantation portion 101PTS may have a depth as deep as bottom surfaces of first trenches which will be formed during subsequent processes. The first type of impurities may include boron. Though not shown in FIG. 4A, impurities may be further injected into the substrate SUB exposed by the first mask pattern 205 in order to control a threshold voltage of the high voltage transistor. The impurities injected to control the threshold voltage may be formed to be shallower than the punch-through stop ion implantation portion 101PTS.

Figure 4B:
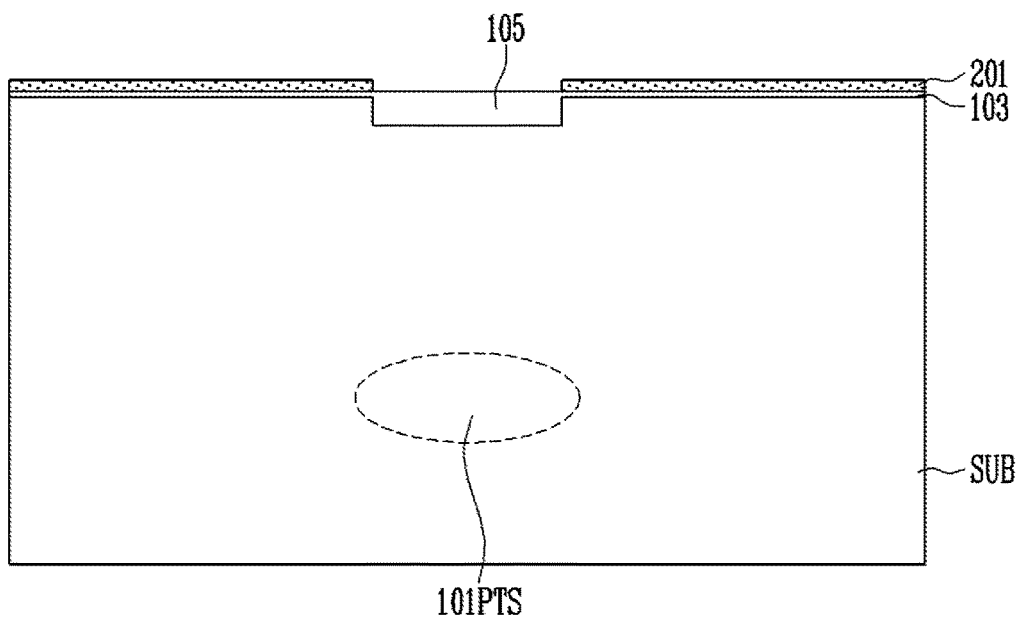

Referring to FIG. 4B, after the first photoresist pattern 203 shown in FIG. 4A is removed, a portion of the first oxide layer 103 opened by the first nitride layer pattern 201 may be removed. As a result, the surface of the substrate SUB which is not exposed by the first nitride layer pattern 201 may be exposed. Subsequently, the exposed surface of the substrate SUB may be oxidized to form the second oxide layer 105. The second oxide layer 105 may serve as a gate insulating layer of the high voltage transistor and have a greater thickness than the first oxide layer 103.

Referring to FIG. 4C, the first nitride layer pattern 201 may be removed. Subsequently, forming a first gate layer over the first and second oxide layers 103 and 105 and forming a second mask pattern 215 on the first gate layer may be performed in a sequential manner. The second mask pattern 215 may have a stacked structure including the second nitride layer pattern 211 and the oxide layer pattern 213. The second nitride layer pattern 211 and the oxide layer pattern 213 may be patterned by an etch process using a second photoresist pattern (not illustrated) as an etch barrier. The second mask pattern 215 may be formed to open regions in which first and second trenches T1 and T2 will be arranged.

Subsequently, the first gate layer, the first oxide layer 103 and the substrate SUB which are exposed through the second mask pattern 215 may be etched to form the first and second trenches T1 and T2. The second trenches T2 may be formed to define the active region A in the high voltage transistor region and serve as isolation regions. The first trenches T1 may be arranged in the active region A between the second trenches T2 and used to increase an effective distance between a gate electrode and a contact plug which will be formed in subsequent processes. According to an embodiment, since the first and second trenches T1 and T2 which function differently from each other are formed at the same time, a high voltage transistor having improved operating characteristics may be manufactured by a simplified process.

Referring to FIG. 4D, a third mask pattern 225 which blocks the second trenches T2 and the memory array region (not illustrated) and opens the first trenches T1 may be formed. The third mask pattern 225 may be a third photoresist pattern.

Subsequently, the first junction regions 101S1 and 101D1 may be formed by injecting a second type of impurities into the substrate SUB exposed by the first trenches T1 using the third mask pattern 225 as an injection barrier. The first junction regions 101S1 and 101D1 may include the first source junction region 101S1 and the first drain junction region 101D1. The first source junction region 101S1 and the first drain junction region 101D1 may be separated from each other. The punch-through stop ion implantation portion 101PTS is formed between the bottom surfaces of the first trenches T1.

The second type of impurities may be injected by using a tilted ion implantation process so that the second type of impurities may be evenly distributed along contours of the first trenches T1. The second type of impurities may be injected to prevent a punch-through phenomenon from occurring in each of the source region and the drain region which may be caused by the first trenches T1. The second type of impurities may be the same type of impurities forming the source region and the drain region. The second type of impurities may be different from the first type of impurities. For example, when a high voltage transistor which will be formed is an NMOS transistor, the second type of impurities injected into the substrate SUB exposed by the first trenches T1 may include phosphorous.

Referring to FIG. 4E, the third mask pattern 225 may be removed to open the second trenches T2 shown in FIG. 4D. Subsequently, an insulating layer may be formed to fill the first trenches T1 and the second trenches T2, and a surface of the insulating layer may be planarized. As a result, the offset insulating layers IA may be formed in the first trenches T1, and the isolation layers IB may be formed in the second trenches T2. According to an embodiment, the offset insulating layers IA and the isolation layers IB may be formed at the same time. After the offset insulating layers IA and the isolation layers IB are formed, the second mask pattern 215 shown in FIG. 4D may be removed.

The offset insulating layers IA and the isolation layers IB may remain higher than upper surfaces of the first oxide layer 103 and the second oxide layer 105. Subsequently, a second gate layer (not shown) may be formed on the substrate SUB including the offset insulating layers IA and the isolation layers IB. Subsequently, a fourth mask pattern (not illustrated) may be formed on the second gate layer. The first gate layer and the second gate layer may be etched by an etch process using the fourth mask pattern as an etch barrier to form the gate electrode G.

The gate electrode G may have a stacked structure including the first gate 111 and the second gate 117. The first gate 111 may remain on the active region A between the offset insulating layers IA. The second gate 117 may have edges EG overlapping with the offset insulating layers IA and remain on the active region A. The gate electrode G having the stacked structure including the first and second gates 111 and 117 may be formed to expose the active region A between the isolation layer IB and the offset insulating layer IA adjacent to each other.

Figure 4F:
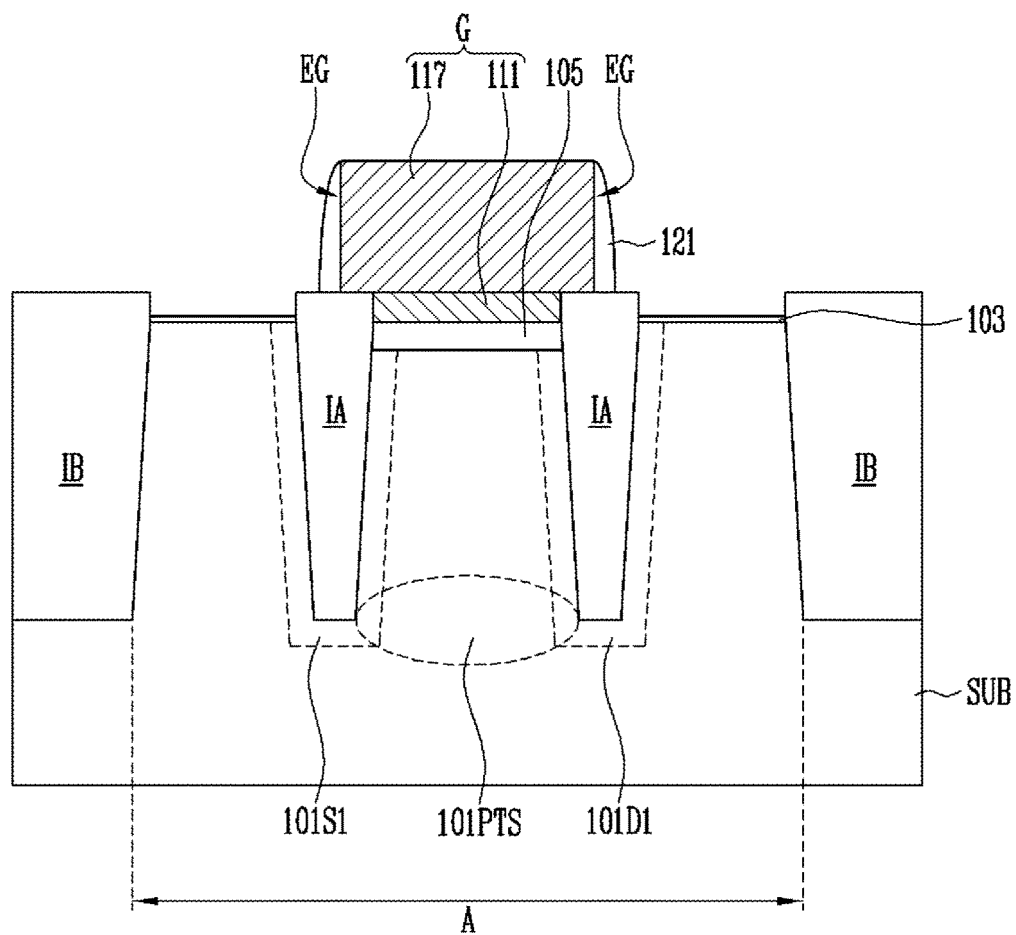

Referring to FIG. 4F, the spacers 121 may be formed on the sidewalls of the gate electrode G. The process of forming the spacers 121 may include depositing an insulating layer and a process of etching the insulating layer to expose a top surface of the gate electrode G by using an etch-back process. The spacers 121 may be arranged on the offset insulating layers IA.

Figure 4G:
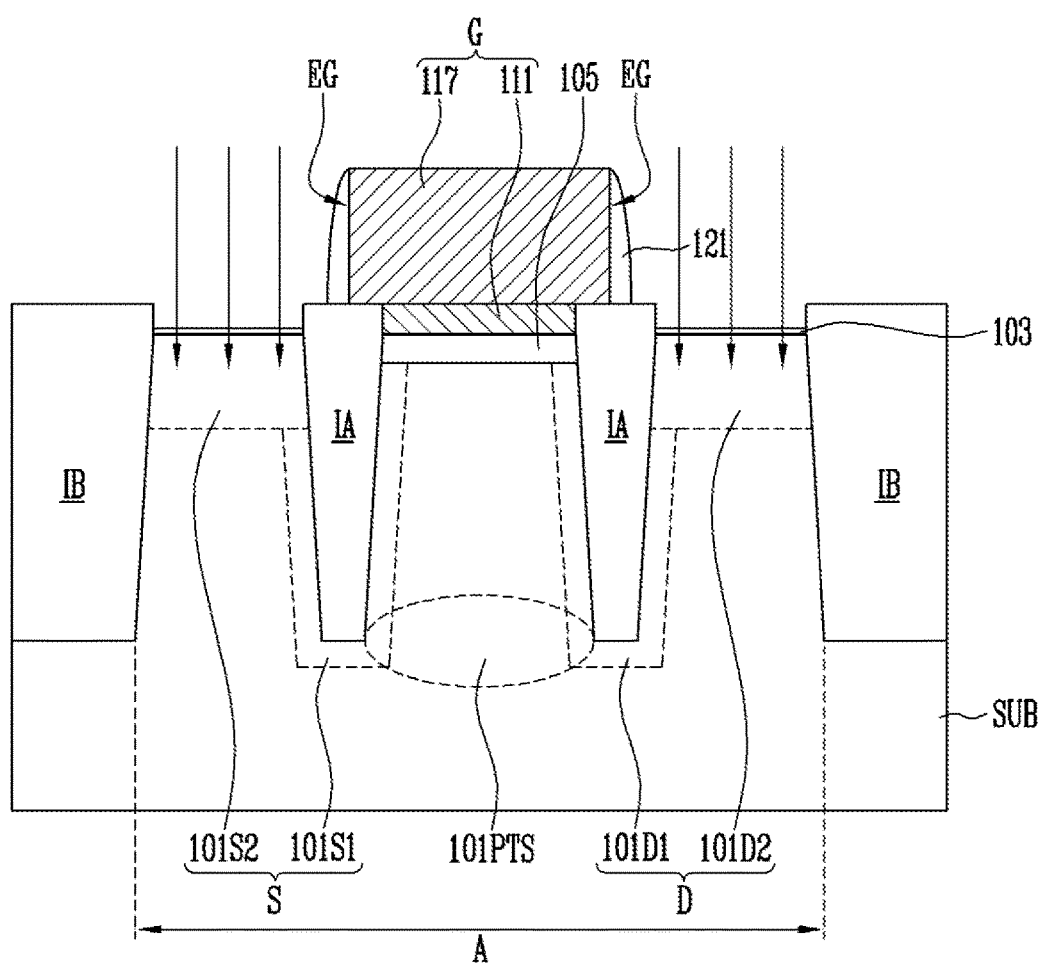

Referring to FIG. 4G, the second type of impurities may be injected into the active region A exposed at both sides of the gate electrode G to form the second junction regions 101S2 and 101D2. The second junction regions 101S2 and 101D2 may include the second source junction region 101S2 and the second drain junction region 101D2. The second junction regions 101S2 and 101D2 may be formed between the offset insulating layer IA and the isolation layer IB adjacent to each other to a predetermined depth. The second type of impurities may be different from the first type of impurities. For example, when a high voltage transistor which will be formed is an NMOS transistor, the second type of impurities injected to form the second junction regions 101S2 and 101D2 may include arsenic and phosphorous. The second type of impurities injected into the second junction regions 101S2 and 101D2 may have a different impurity concentration from the second type of impurities injected into the first junction regions 101S1 and 101D1. For example, the second type of impurities injected into the second junction regions 101S2 and 101D2 may have a higher or lower impurity concentration than the second type of impurities injected into the first junction regions 101S1 and 101D1.

The second junction regions 101S2 and 101D2 may be coupled to the first junction regions 101S1 and 101D1. The first source junction region 101S1 and the second source junction region 101S2, in combination, may serve as the source region of the high voltage transistor. The first drain junction region 101D1 and the second drain junction region 101D2, in combination, may serve as the drain region D of the high voltage transistor.

A second type of impurities having a lower concentration than those injected into the second junction regions 101S2 and 101D2 may be injected into the first junction regions 101S1 and 101D1 so that a light doped drain (LDD) structure may be formed in the source region S and the drain region D. Therefore, according to an embodiment, the LDD structure may be formed in the source region S and the drain region D to prevent a short channel phenomenon.

According to another embodiment, to lower a resistance of a current path formed in the first junction regions 101S1 and 101D1, a second type of impurities having a higher concentration than those injected into the second junction regions 101S2 and 101D2 may be injected into the first junction regions 101S1 and 101D1.

Figure 5:
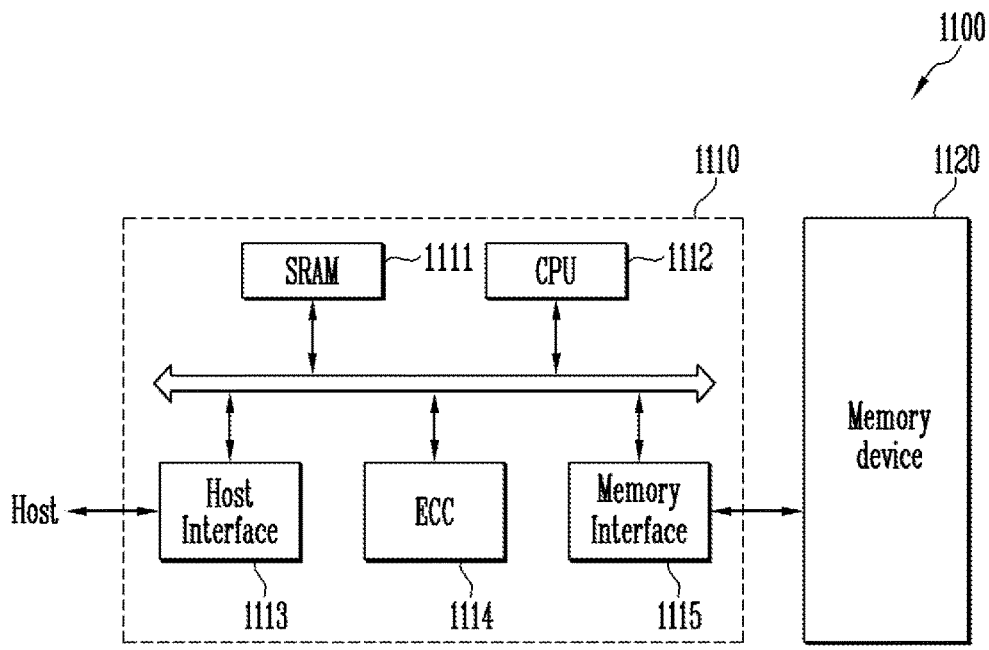
FIG. 5 is a diagram illustrating a configuration of a memory system according to an embodiment of the present invention.

FIG. 5 is a block diagram illustrating a configuration of a memory system according to an embodiment. As illustrated in FIG. 5, a memory system 1100 according to an embodiment may include a non-volatile memory device 1120 and a memory controller 1110.

The non-volatile memory device 1120 may have the structure described above with reference to FIGS. 1 to 4G. In addition, the non-volatile memory device 1120 may be a multi-chip package including a plurality of flash memory chips.

The memory controller 1110 may be configured to control the non-volatile memory device 1120. The memory controller 1110 may include static random access memory (SRAM) 1111, a central processing unit (CPU) 1112, a host interface 1113, an error check and correction unit (ECC) 1114 and a memory interface 1115. The SRAM 1111 may function as an operation memory of the CPU 1112. The CPU 1112 may perform general control operations for data exchange with the memory controller 1110. The host interface 1113 may include a data exchange protocol for a host coupled to the memory system 1100. In addition, the ECC 1114 may detect and correct errors included in data read from the non-volatile memory device 1120. The memory interface 1115 may interface between the non-volatile memory device 1120 and a memory controller 1110. The memory controller 1110 may further include a read-only memory (ROM) that stores code data to interface with the host.

The memory system 1100 having the above-described configuration may be a solid state disk (SSD) or a memory card in which the memory device 1120 and the memory controller 1110 are combined. For example, when the memory system 1100 is an SSD, the memory controller 1110 may communicate with an external device such as a host through one of the interface protocols including USB, MMC, PCI-E, SATA, RATA, SCSI, ESDI and IDE.

Figure 6:
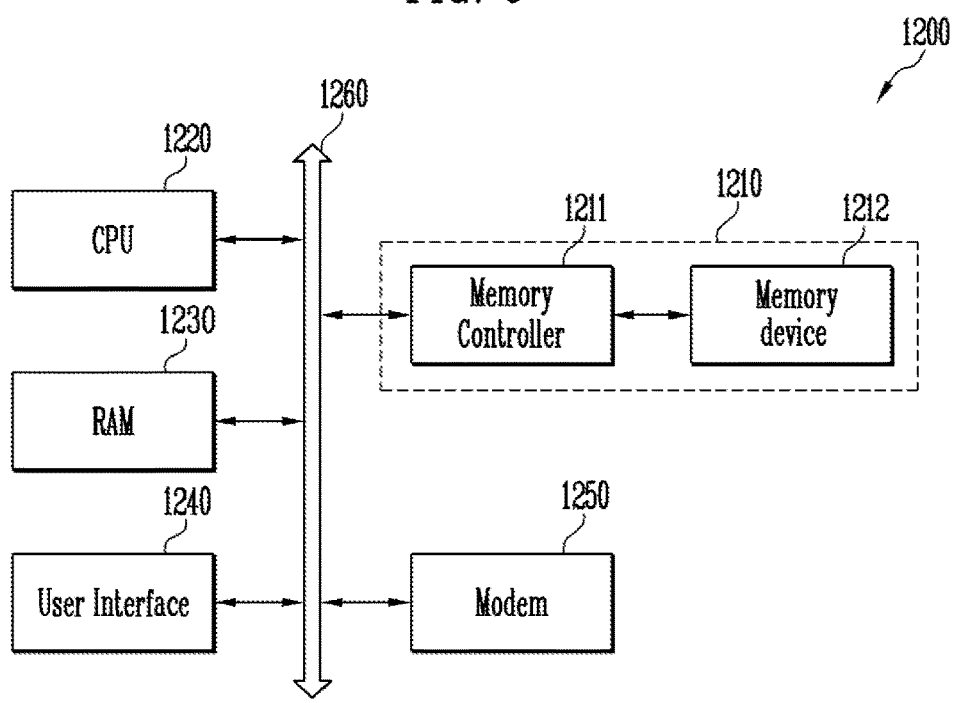
FIG. 6 is a diagram illustrating a configuration of a computing system according to an embodiment of the present invention.

FIG. 6 is a block diagram illustrating a configuration of a computing system according to an embodiment. Referring to FIG. 6, a computing system 1200 according to an embodiment may include a CPU 1220, RAM 1230, a user interface 1240, a modern 1250 and a memory system 1210 that are electrically coupled to each other by a system bus 1260. In addition, when the computing system 1200 is a mobile device, a battery may be further included to apply an operating voltage to the computing system 1200. The computing system 1200 may further include application chipsets, a Camera Image Processor (CIS), or mobile DRAM.

As described above in connection with FIG. 5, the memory system 1210 may include a non-volatile memory 1212 and a memory controller 1211. According to an embodiment, since offset insulating layers are formed in an active region of a peripheral region in which a high voltage transistor is arranged, an effective distance between a gate electrode and a contact plug may be increased in a predetermined limited area. Therefore, according to an embodiment, a breakdown voltage BV of the high voltage transistor in the predetermined limited area may be improved.

According to an embodiment, since edges of the gate electrode of the high voltage transistor overlap with the offset insulating layers, a leakage current of the high voltage transistor may be reduced. According to an embodiment, since the offset insulating layers have substantially the same depth as isolation layers defining the active region, a breakdown voltage of the high voltage transistor may be improved.

According to an embodiment, since the offset insulating layers and the isolation layers are formed at the same time, a high voltage transistor having improved characteristics may be provided without an additional mask process. According to an embodiment, junction regions serving as a source region and a drain region are formed along surfaces of the offset insulating layers, an operational failure of the high voltage transistor which may be caused by the formation of the offset insulating layers may be prevented.

According to an embodiment, since a punch-through stop ion implantation portion is arranged between the offset insulating layers, a punch-through phenomenon between the junction regions may be prevented.

It will be apparent to those skilled in the art that various modifications can be made to the above-described exemplary embodiments of the present invention without departing from the spirit or scope of the invention as defined in the following claims.

What is claimed is:
1. A semiconductor device, comprising:
a substrate including a memory array region and a peripheral region;
isolation layers formed in the peripheral region to define an active region;
offset insulating layers separated from each other and formed in the active region;
a gate electrode having edges overlapping with the offset insulating layers and arranged in the active region between the offset insulating layers; and a punch-through stop implantation portion formed at substantially the same level as bottoms of the offset insulating layers and formed between the offset insulating layers.

2. The semiconductor device of claim 1, further comprising:
first junction regions formed in the substrate along contours of the offset insulating layers; and
second junction regions formed in the substrate in the active region and between the offset insulating layers and the isolation layers,
wherein each of the second junction regions is coupled to a corresponding first junction regions.

3. The semiconductor device of claim 2, wherein the punch-through stop implantation portion is provided between the first junction regions and extends into the active region so as to be deeper than the bottoms of the offset insulating layers.

4. The semiconductor device of claim 3, wherein the punch-through stop ion implantation portion includes first type impurities, and
wherein each of the first and second junction regions includes second type impurities different from the first type impurities.

5. The semiconductor device of claim 4, wherein the second type impurities in the first junction regions have a different concentration from the second type impurities in the second junction regions.

6. The semiconductor device of claim 1, wherein the gate electrode comprises:
a first gate arranged between the offset insulating layers; and
a second gate formed over the first gate and having edges overlapping with the offset insulating layers.

7. The semiconductor device of claim 1, further comprising:
a memory string arranged in the memory array region and including memory cells coupled to each other in series.

8. The semiconductor device of claim 7,
wherein the memory cells are arranged in a two-dimensional over a surface of the substrate, and
wherein the memory cells are coupled to each other in series through cell junction regions formed in the substrate between the memory cells.

9. The semiconductor device of claim 7,
wherein the memory string includes a pillar type channel layer and the memory cells stacked along the pillar type channel,
wherein the pillar type channel layer is coupled to the substrate and extends in a first direction in which the memory cells are stacked, and
wherein the memory cells are coupled to each other in series along the first direction.

10. The semiconductor device of claim 7,
wherein the memory string includes a U-shaped channel layer arranged over the substrate and the memory cells coupled to each other in series,
wherein the memory cells are arranged along a U-shaped channel layer.

11. The semiconductor device of claim 1, wherein widths of the offset insulating layers are smaller than those of the isolation layers.

\* \* \* \* \*